US009391439B2

(12) United States Patent
Nordfors

(10) Patent No.: US 9,391,439 B2
(45) Date of Patent: Jul. 12, 2016

(54) PARTITION FOR IMMERSIBLE MACHINE

(75) Inventor: Gunnar Nordfors, Stockholm (SE)

(73) Assignee: Xylem IP Holdings LLC, White Plains, NY (US)

( * ) Notice: Subject to any disclaimer, the term of this patent is extended or adjusted under 35 U.S.C. 154(b) by 476 days.

(21) Appl. No.: 14/006,518

(22) PCT Filed: Mar. 22, 2012

(86) PCT No.: PCT/SE2012/050316
§ 371 (c)(1),
(2), (4) Date: Sep. 20, 2013

(87) PCT Pub. No.: WO2012/128713
PCT Pub. Date: Sep. 27, 2012

(65) Prior Publication Data
US 2014/0008878 A1    Jan. 9, 2014

(30) Foreign Application Priority Data
Mar. 24, 2011   (SE) ........................ 1150265

(51) Int. Cl.
*H02K 5/06* (2006.01)
*H02G 3/22* (2006.01)
*F04D 13/08* (2006.01)
(Continued)

(52) U.S. Cl.
CPC .............. *H02G 3/22* (2013.01); *F04D 13/0693* (2013.01); *F04D 13/08* (2013.01); *F04D 13/083* (2013.01); *H01R 4/4809* (2013.01); *H01R 11/09* (2013.01); *H01R 13/523* (2013.01); *H02K 5/132* (2013.01); *H02K 5/225* (2013.01); *H05K 5/069* (2013.01)

(58) Field of Classification Search
CPC ...... H02K 5/132; H02K 5/225; H02K 5/1285
See application file for complete search history.

(56) References Cited

U.S. PATENT DOCUMENTS

RE26,133 E   *  1/1967  Wright .................... F04D 13/10
                                                         417/360
3,952,218 A  *  4/1976  Deters .................... H02K 5/132
                                                         310/71
(Continued)

FOREIGN PATENT DOCUMENTS

DE          19504099 A1    8/1996
EP          2263757 A1    12/2010

OTHER PUBLICATIONS

International Search Report, dated Jun. 4, 2012, corresponding to PCT/SE2012/050316, filed Mar. 22, 2012.
(Continued)

*Primary Examiner* — Dang Le
(74) *Attorney, Agent, or Firm* — RatnerPrestia

(57) ABSTRACT

A partition for fluid tight sealing between a motor compartment and a coupling compartment of an immersible machine is described. The partition includes a partition wall having a seat, and at least one coupling terminal arranged in the seat, the coupling terminal being accessible from a primary side of the partition, and from a secondary side of the partition. A sealing member is located in at least a part of the interface between the seat of the partition wall and the coupling terminal, and a retention means is arranged to retain the coupling terminal in the seat. The coupling terminal includes a primary spring clip engageable from the primary side and a secondary spring clip engageable from the secondary side. Also disclosed is an immersible machine including such a partition.

11 Claims, 2 Drawing Sheets

(51) Int. Cl.
  *H02K 5/132* (2006.01)
  *H02K 5/22* (2006.01)
  *F04D 13/06* (2006.01)
  *H05K 5/06* (2006.01)
  *H01R 4/48* (2006.01)
  *H01R 11/09* (2006.01)
  *H01R 13/523* (2006.01)

(56) References Cited

U.S. PATENT DOCUMENTS

| | | | |
|---|---|---|---|
| 4,456,844 A * | 6/1984 | Yamamoto | H02K 11/26 310/43 |
| 5,704,717 A * | 1/1998 | Cochimin | F16C 17/22 310/87 |
| 5,801,465 A | 9/1998 | Yamada | |
| 6,897,584 B2 * | 5/2005 | Doherty | H02K 5/225 310/71 |
| 6,899,532 B2 * | 5/2005 | Eddy | H01R 13/5219 310/71 |
| 7,833,038 B1 | 11/2010 | King, Jr. et al. | |
| 2003/0190243 A1 | 10/2003 | Eddy et al. | |
| 2008/0219857 A1 | 9/2008 | Keener | |

OTHER PUBLICATIONS

European Search Report, dated Nov. 20, 2014, corresponding to counterpart European Patent Application No. 12 761 498.0.

* cited by examiner

PARTITION FOR IMMERSIBLE MACHINE

CROSS-REFERENCE TO RELATED APPLICATIONS

This application is a U.S. National Phase of PCT Application No. PCT/SE2012/050316, filed Mar. 22, 2012, which claims priority to Swedish Patent Application No. SE1150265-5, filed Mar. 24, 2011, each of which is incorporated by reference herein in their entirety.

TECHNICAL FIELD OF THE INVENTION

The present invention relates in general to a partition for fluid tight sealing between a motor compartment and a coupling compartment of an immersible machine, such as a pump, mixer, etc. Said motor compartment is often referred to as stator housing. Specifically the present invention relates to a partition comprising a partition wall having a seat, and at least one coupling terminal made of an electrically conducting material and being arranged in said seat. The coupling terminal is accessible from a primary side of the partition, which primary side preferably is arranged facing the motor compartment, and from a secondary side of the partition, which secondary side preferably is arranged facing the coupling compartment. According to a second aspect of the present invention it relates to an immersible machine comprising such a partition.

BACKGROUND OF THE INVENTION AND PRIOR ART

Known partitions belong to one or other of two general groups, a first group which like the present invention tries to supply fluid tight sealing between the coupling compartment of the immersible machine into which process liquid may enter and the motor compartment of the immersible machine into which lubricant and process liquid may enter, and a second group allowing fluid communication between the coupling compartment and the motor compartment and thereto allow a certain amount of process liquid in the coupling compartment before it leak into the motor compartment.

The second group presents a partition comprising a so-called tower having an appropriate height, which tower perform the function of an overflow. Thereto, the primary function of the tower is to guide the electric conductors from the coupling compartment to the motor compartment and to the drive unit of the immersible machine. However, immersible machines comprising a partition from the second group suffer from the drawback that if the immersible machine is tilted or shaken the process liquid runs the risk of leaking from the coupling compartment to the motor compartment long before the allowed level is reached, whereupon the drive unit runs the risk of getting damaged, and vice versa. The first group presents a partition comprising a fluid tight partition wall made of plastic and coupling terminals extending there through, which coupling terminals are embedded in the partition wall and which presents screw retentions in each end.

However, immersible machines comprising a partition belonging to the first group have the drawback that said embedment rarely or never is fluid tight, and that the screw retentions has the disadvantage that they may shake loose during operation and faultless coupling of the electrical conductors in the screw retentions is exclusively dependent on the skills of the operator.

OBJECT OF THE INVENTION

The present invention aims at obviating the above mentioned drawbacks and disadvantages of previously known partitions and at providing an improved partition. A basic object of the invention is to provide an improved partition of initially disclosed type, which guarantees liquid tight sealing.

Another object of the present invention is to provide a partition, which guarantees that the electrical conductors do not automatically come loose when they have been connected to the partition.

Another object of the present invention is to provide a partition, which is easy to handle for the operator during connection of the electrical conductors.

BRIEF DESCRIPTION OF THE INVENTION

According to the invention at least the basic object of the invention is attained by means of the initially defined partition, which is characterized in that the partition comprises a sealing member is located in at least a part of the interface between the seat of the partition wall and the coupling terminal, and that a retention means is arranged to retain the coupling terminal in said seat, wherein the coupling terminal comprises a primary spring clip engageable from said primary side and a secondary spring clip engageable from said secondary side.

Preferred embodiments of the present invention are further defined in the dependent claims.

Preferably the sealing member is located at the interface between the seat of the partition wall, the coupling terminal and the retention means. This entail that the retention of the coupling terminal is guaranteed at the same time as faultless liquid tightness is guaranteed upon application of the retention means.

According to a preferred embodiment the primary spring clip is located in a primary seat of the coupling terminal, said primary spring clip being retained in said primary seat by means of the retention means. It is also preferred that the secondary spring clip is located in a secondary seat of the coupling terminal, said secondary spring clip being retained in said secondary seat by means of the partition wall. This entail that the partition does not need any complicated special devices in order to secure that the spring clips are retained the seats thereof.

In another preferred embodiment each spring clip is shaped like an loop and comprises a stationary part arranged to abut a pin protruding from the respective seat, and a movable part that in its turn comprises a back part and a grip part connected to said back part, the back part being connected to the stationary part in the lower ends thereof and the grip part presenting an opening, which house the upper end of the stationary part as well as the upper end of said pin.

The object of the invention is attained by means of the initially defined immersible machine, which is characterized in that it comprises an inventive partition located at the interface between said motor compartment and said coupling compartment.

Further advantages and features of the invention are apparent from the other dependent claims as well as from the following detailed description of preferred embodiments.

BRIEF DESCRIPTION OF THE DRAWINGS

A more complete understanding of the above mentioned and other features and advantages of the present invention will be apparent from the following, detailed description of preferred embodiments with reference to the appended drawings, in which.

DETAILED DESCRIPTION OF PREFERRED EMBODIMENTS

Figure 1:
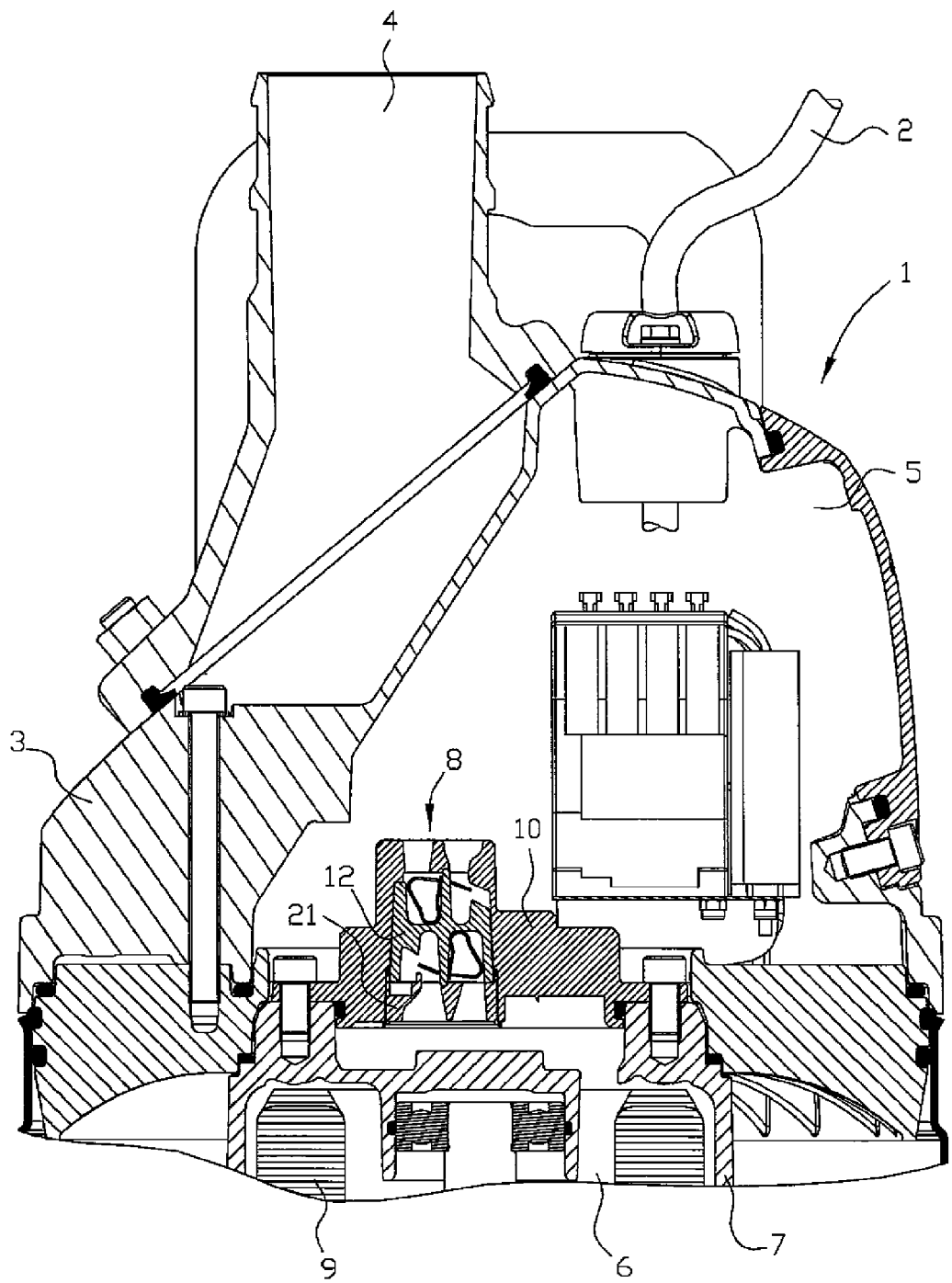
FIG. 1 is a schematic section view showing a pump top comprising an inventive partition.

Reference is initially made to FIG. 1, in which a part of an immersible machine, generally designated 1, is disclosed. An immersible machine includes according to the invention at least pumps, mixers, etc. designed for treatment, transportation, etc. of process liquid such as sewage and waste water. However, also other immersible machines are included which are arranged to be wholly or partly immersed in process liquid and which are electrically driven via one or more power cables 2. In the following detailed description the immersible machine will be visualized by means of a pump, and the use of the term pump shall be considered equivalent with the term immersible machine.

The pump 1 comprises a housing 3 delimiting the inside of the pump 1 from the surrounding process liquid, and comprises thereto an inlet, a hydraulic unit (not shown) and an outlet 4 for the pumped liquid. The pump 1 comprises thereto a coupling compartment 5 and a motor compartment 6 that mostly is defined by a so called stator housing 7. Furthermore, the pump comprises an inventive partition, generally designated 8, for fluid tight sealing between said motor compartment 6 and said coupling compartment 5. The partition 8 is connected to the stator housing 7 in such a way that the interface between the partition 8 and the stator housing 7 is fluid tight, preferably the partition 8 is detachably connected to the stator housing 7. The object of the partition 8, besides to connect the drive unit 9 of the pump 1 to the power cable 2, is primarily to secure that surrounding process liquid that might have leaked into the coupling compartment 5 do not enter into the motor compartment 6 and thereby jeopardize to damage the drive unit 9 of the pump 1. The partition also secure that lubrication and process liquid that might have leaked into the stator housing 7 do not enter into the coupling compartment 5. Said power cable 2 is in a conventional manner guided into the coupling compartment 5 whereby the electric conductors of the power cable are connected to various units demanding power supply, whereupon one or several electric conductors are guided direct or indirect to the inventive partition 8. From the partition 8 other electric conductors run to the drive unit 9, or other units demanding power supply. It shall be pointed out that said electric conductors as well can be constituted by signal cables or the like, the object of which is not to supply power but to transmit electric signals.

Figure 2:
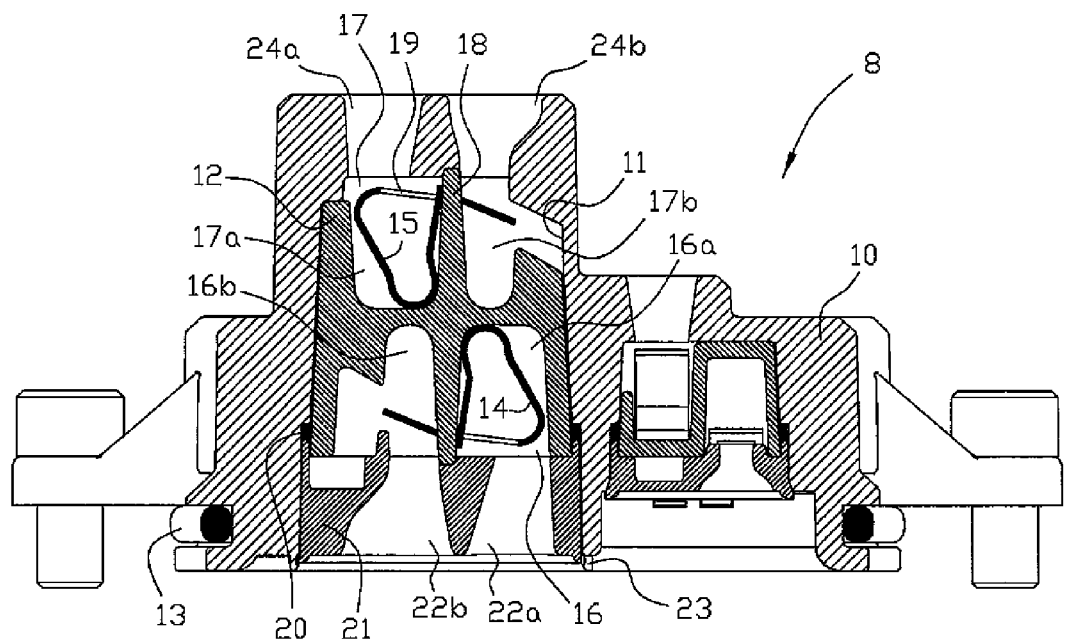
FIG. 2 is a schematic section view of an inventive partition.
Figure 3:
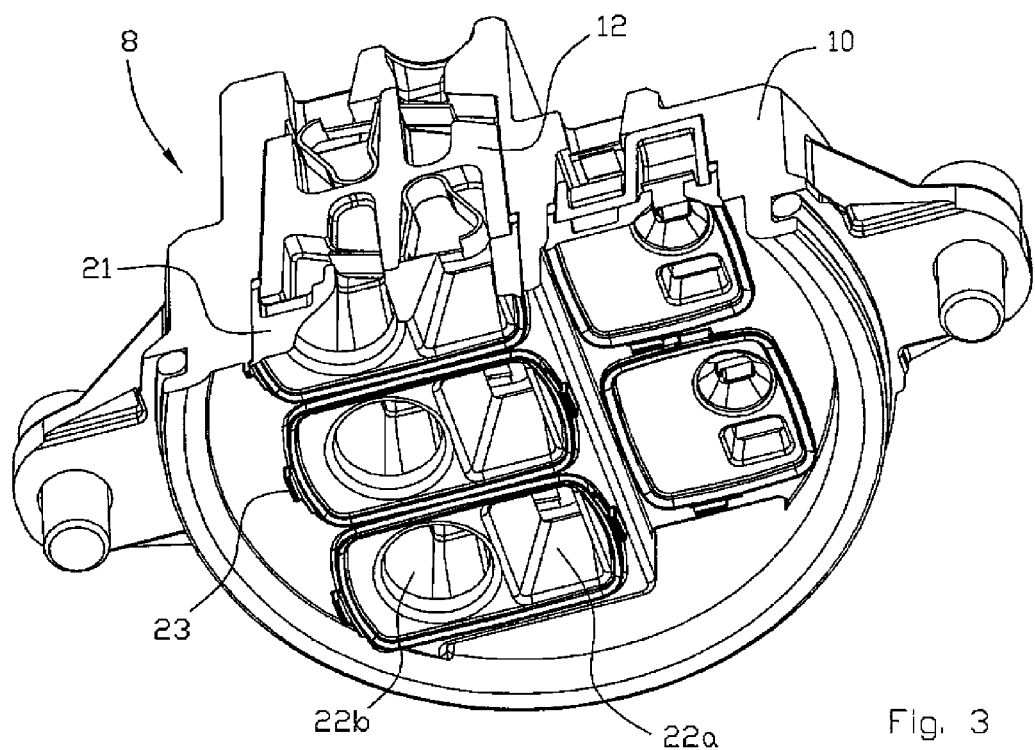
FIG. 3 is a perspective section view of the partition shown in FIG. 2.

Reference is now primarily made to FIGS. 2 and 3, which discloses a preferred embodiment of the inventive partition 8.

The partition 8 comprises a partition wall 10 having at least one seat 11, and at least one coupling terminal 12 that is made of an electrically conducting material and that is located in said at least one seat 11. The partition wall 10 is made of an electrically non conducting material, such as plastic. The partition wall 10 comprises an O-ring 13, or the like, for fluid tight sealing of the interface between the partition 8 and the stator housing 7, whereupon the partition 8 is detachably connected to the stator housing 7, preferably by means of screws, snap locking or press fit. It shall be pointed out that the partition 8 alternatively may be connected to any other construction element of the pump 1, such as its housing 3, as long as the partition 8 provides fluid tight sealing between the coupling compartment 5 and the motor compartment 6.

Furthermore the coupling terminal 12 shall be accessible from a primary side of the partition 8, which primary side preferably is arranged to face towards the motor compartment 6, as well as from a secondary side of the partition 8, which secondary side preferably is arranged to face towards the coupling compartment 5. However, it shall be pointed out that also the reverse condition may prevail without departing from the basic inventive idée. Thus, the electrical conductors (not shown), which are directly or indirectly connected to the power cable 2, shall be connectable to the coupling terminal 12 from the coupling compartment 5, at the same time as electrical conductors (not shown), which are directly or indirectly connected to the drive unit 9, shall be connectable to the coupling terminal 12 from the motor compartment 6. Thereto the coupling terminal 12 comprises a primary spring clip 14 engageable from said primary side and a secondary spring clip 15 engageable from said secondary side. It shall be pointed out that said primary spring clip 14 and said secondary spring clip 15 preferably are arranged above each other or side by side. These two configurations are shown in FIGS. 2 and 3, in which the spring clips are arranged above each other in the coupling terminal to the left and arranged side by side in the coupling terminal to the right.

It is preferred that the primary spring clip 14 is arranged in a primary seat 16 of the coupling terminal 12, and that the secondary spring clip 15 is arranged in a secondary seat 17 of the coupling terminal 12. The primary spring clip 14 and the primary seat 16 are preferably constructed as the secondary spring clip 15 and the secondary seat 17, respectively, which will be described in detail below and which in an analogous way is valid for the primary spring clip 14 and the primary seat 16.

In the shown preferred embodiment the secondary seat 17 comprises a first part 17a and a second part 17b.

Preferably the secondary spring clip 15 is shaped like a loop and comprises a stationary part and a movable part. The stationary part is arranged to abut a pin 18 protruding from the secondary seat 17, which pin wholly or partly form a boundary line between the first part 17a and the second part 17b of the secondary seat 17. Thereto, the movable part comprises a back part and a grip part connected to said back part, the back part being connected to the stationary part in the lower ends thereof and the grip part presenting an opening 19, intended to receive an electric conductor. Said opening 19 is arranged to house the upper end of the pin 18 of the secondary seat 17, as well as preferably the upper end of the stationary part. Thus, the secondary spring clip 15 is arranged in such a way that as the back part thereof is pressed towards the stationary part thereof the opening 19 of the grip part will admit insertion of the electric conductor in the second part 17b of the secondary seat 17 via said opening 19, whereupon the electric conductor is clamped between the pin 18 or the secondary seat 17 and the edge of the opening 19 when the back part is allowed to spring back in the direction away from the stationary part.

In connection with the insertion of the electrical conductor in the second part 17b of the secondary seat 17, an operator handled engagement device is preferably used, such as a screw driver or the like, that is inserted into the first part 17a of the secondary seat 17 in order to press the back part of the secondary spring clip 15 in the direction of the stationary part thereof.

According to the invention the partition 8 furthermore comprises a sealing member 20, such as an O-ring or the like, arranged in at least a part of the interface between the seat 11 of the partition wall 10 and the coupling terminal 12, wherein the partition wall 10, the sealing member 20 and the coupling terminal 12 together provides a fluid tight sealing between the motor compartment 6 and the coupling compartment 5. The coupling terminal 12 is retained in the seat 11 of the partition wall 10 by means of a retention means 21 comprised in the inventive partition 8. Preferably the sealing member 20 is arranged in the interface between the seat 11 of the partition wall 10, the coupling terminal 12 and the retention means 21, whereupon the sealing member 20 is clamped and seal in connection with the attachment of the retention means 21.

Preferably the coupling terminal 12, and thereby said primary spring clip 14 and said primary seat 16, is accessible from said primary side via at least a through hole in the retention means 21. It is more preferred that the first part 16a of the primary seat 16 is engageable via a first opening 22a in the retention means 21, and that the second part 16b of the primary seat 16 is engageable via a second opening 22b in the retention means 21. It is also preferred that said primary spring clip 14 is retained in said primary seat 16 be means of the retention means 21, which is connected to the partition wall 10 by means of snap locking means 23.

Preferably the coupling terminal 12, and thereby said secondary spring clip 15 and said secondary seat 17, is accessible from said secondary side via at least a through hole in the partition wall 10. It is more preferred that the first part 17a of the secondary seat 17 is engageable via a first opening 24a in the partition wall, and that the second part 17b of the secondary seat 17 is engageable via a second opening 24b in the partition wall 10. It is also preferred that said secondary spring clip 15 is retained in said secondary seat 17 be means of the partition wall 10.

FEASIBLE MODIFICATIONS OF THE INVENTION

The invention is not limited only to the embodiments described above and shown in the drawings, which primarily have an illustrative and exemplifying purpose. This patent application is intended to cover all adjustments and variants of the preferred embodiments described herein, thus the present invention is defined by the wording of the appended claims and the equivalents thereof. Thus, the equipment may be modified in all kinds of ways within the scope of the appended claims.

It shall also be pointed out that all information about/concerning terms such as above, under, upper, lower, etc., shall be interpreted/read having the equipment oriented according to the figures, having the drawings oriented such that the references can be properly read. Thus, such terms only indicates mutual relations in the shown embodiments, which relations may be changed if the inventive equipment is provided with another structure/design.

It shall also be pointed out that even thus it is not explicitly stated that features from a specific embodiment may be combined with features from another embodiment, the combination shall be considered obvious, if the combination is possible.

The invention claimed is:

1. A partition for fluid tight sealing between a motor compartment and a coupling compartment of an immersible machine, comprising:
   a partition wall having a seat, and at least one coupling terminal made of an electrically conducting material and being arranged in said seat, the coupling terminal being accessible from a primary side of the partition and from a secondary side of the partition, wherein the partition comprises a sealing member located in at least a part of an interface between the seat of the partition wall and the coupling terminal, and
   a retention means is arranged to retain the coupling terminal in said seat, wherein the coupling terminal comprises a primary spring clip engageable from said primary side and a secondary spring clip engageable from said secondary side.

2. The partition according to claim 1, wherein said primary side of the partition is arranged to face towards the motor compartment and said secondary side of the partition is arranged to face towards the coupling compartment.

3. The partition according to claim 1, wherein the sealing member is arranged in the interface between the seat of the partition wall, the coupling terminal and the retention means.

4. The partition according to claim 1, wherein the coupling terminal is accessible from said primary side via at least a trough opening in the retention means.

5. The partition according to claim 1, wherein the coupling terminal is accessible from said secondary side via at least a trough opening in the partition wall.

6. The partition according to claim 1, wherein the primary spring clip is located in a primary seat of the coupling terminal, said primary spring clip being retained in said primary seat by the retention means.

7. The partition according to claim 6, wherein the secondary spring clip is located in a secondary seat of the coupling terminal, said secondary spring clip being retained in said secondary seat by the partition wall.

8. The partition according to claim 7, wherein said secondary spring clip is shaped like a loop and comprises a stationary part that is arranged to abut a pin protruding from the secondary seat, and a movable part comprising a back part and a grip part connected to said back part, wherein the back part is connected to the stationary part in a lower end thereof and the grip part presenting an opening, which accommodate an upper end of said pin.

9. The partition according to claim 8, wherein the primary spring clip is of the same type as the secondary spring clip.

10. The partition according to claim 1, wherein the retention means is connected to the partition wall by snap locking means.

11. An immersible machine comprising a motor compartment, a coupling compartment, and the partition according to claim 1, which partition is arranged in the interface between said motor compartment and said coupling compartment.

* * * * *